United States Patent [19]

Tonooka

[11] Patent Number: 4,838,799
[45] Date of Patent: Jun. 13, 1989

[54] I.C. SOCKET HAVING CONDUCTIVE PLASTIC CONTACTS

[75] Inventor: Takashi Tonooka, Suntougun, Japan

[73] Assignee: Texas Instruments Incorporated, Dallas, Tex.

[21] Appl. No.: 74,122

[22] Filed: Jul. 16, 1987

[30] Foreign Application Priority Data

Jul. 25, 1986 [JP] Japan .................................. 61-175313

[51] Int. Cl.[4] .......................... H01R 9/09; H01R 9/24; H05K 1/00
[52] U.S. Cl. ........................................ 439/70; 439/86; 439/525; 439/886; 439/931
[58] Field of Search ................................... 439/70–72, 439/524–526, 886, 931, 86–91

[56] References Cited

U.S. PATENT DOCUMENTS

| | | | |
|---|---|---|---|
| 4,260,212 | 4/1981 | Ritchie et al. | 439/395 |
| 4,460,236 | 7/1984 | Strautz | 439/525 |
| 4,679,884 | 7/1987 | Klemp | 439/596 |
| 4,684,182 | 8/1987 | Gussman | 439/68 |
| 4,717,347 | 1/1988 | Babow et al. | 439/525 |
| 4,747,783 | 5/1988 | Bellamy et al. | 439/886 |
| 4,786,256 | 11/1988 | Angeleri et al. | 439/72 |

OTHER PUBLICATIONS

Cherian et al, Low Insertion Force DIP Socket w/Ejection Feature for testing, Programming & Burn-in Applications, Oct. 1979, pp. 350–358, Amp Inc.

Primary Examiner—P. Austin Bradley
Attorney, Agent, or Firm—James P. McAndrews; John A. Haug; Melvin Sharp

[57] ABSTRACT

An IC socket which has contacts positioned corresponding to each pin position of an IC to be inserted and a body portion holding the contacts, characterized in that at least a part of the contact is formed of conductive resin.

5 Claims, 2 Drawing Sheets

I.C. SOCKET HAVING CONDUCTIVE PLASTIC CONTACTS

BACKGROUND OF THE INVENTION

1. Field of the Invention

The present invention relates to an IC socket, especially, to an improvement of a contract of an IC socket.

2. Description of the Prior Art

Contacts of an IC socket of the prior art are generally formed of metal plate, therefore, an external resistance element must be mounted for each contact when the IC socket is used, for example, for a burn-in test.

Namely, in the prior-art structure shown in FIG. 1, plural IC sockets 2 are mounted on a mounting board 1 in a given arrangement. An external resistance element 3 is connected with each contact of individual IC socket 2, and each IC socket 2 is connected to a test circuit ( not shown ) through these external resistance elements 3. However, an external resistance element 3 is not necessary for the contacts for a power source voltage pin and an earth voltage pin of the IC socket 2. When implementing a burn-in test, plural mounting boards 1 with the IC sockets mounted thereon in the above-described way are put together into an oven for the test to be heated.

However, in such prior-art structure, it is indispensible to attach many external resistance elements 3 to the mounting board 1, which results in complicated assembling. Besides, large area is required for the external resistance elements 3 on the mounting board 1, therefore the mounting density of the socket 1 is not so high.

Moreover, whether the IC socket is used for the burn-in test or not, the contact of the IC socket made of a metal plate has a disadvantage that it exhibits a poor resistance to corrosion environment and an insufficient productivity due to a precise press processing required.

OBJECTS AND SUMMARY OF THE INVENTION

An object of the present invention is to provide an IC socket which shows a good resistance to corrosion environment and a high productivity, and which can makes external resistance elements unnecessary to be mounted when used, for example, for a burn-in test.

Namely, the present invention provides an IC socket which has respective contacts disposed corresponding to each pin position of an IC to be attached and a body portion holding the contacts, the improvement in that at least a part of the contact is formed of conductive resin.

According to the IC socket of the present invention, because at least a part of the contact is formed of conductive resin, the problem of weakness to corrosion environment peculiar to metal material is overcome and producivity is improved by making a precice press processing unnecessary, and furthermore, mounting of an external resistance element is unnecessary by giving a function as an electric resistance element to the contact itself when used for a burn-in test.

Other objects, features and advantages of the invention will appear more fully from the following detailed description thereof taken in connection with the accompanying drawings.

DESCRIPTION OF THE PREFERRED EMBODIMENTS

The preferred embodiments of the present invention will be explained below based on the accompanying drawings.

Figure 1:
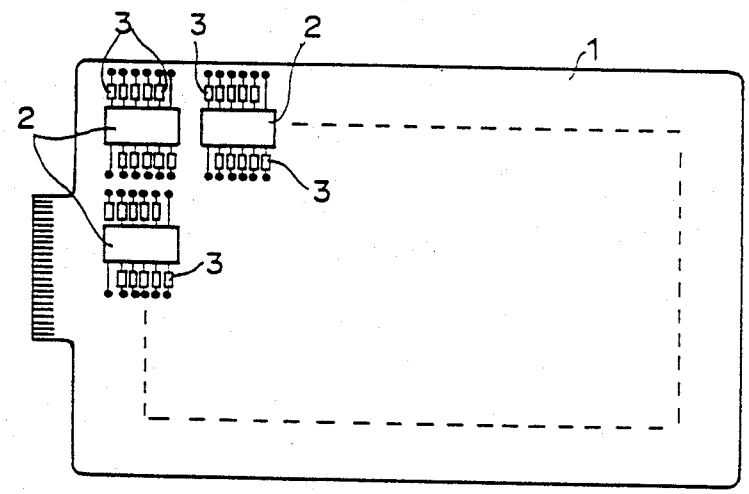
FIG. 1 is a plane view showing an example in which the prior-art IC socket is used for a burn-in test.
Figure 2:
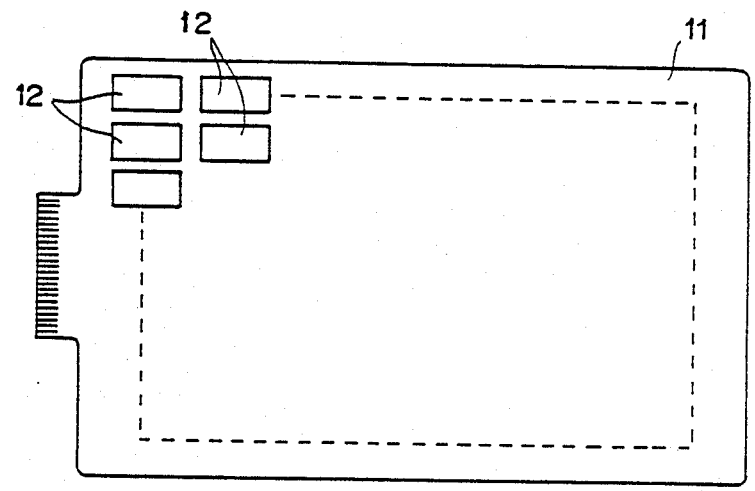
FIG. 2 is a plane view showing a preferred embodiment in which an IC socket of the present invention is used for a burn-in test.

FIG. 2 shows a preferred embodiment wherein an IC socket of the present invention is used for a burn-in test.

In FIG. 2, plural IC sockets 12 of the preferred embodiment of the present invention are mounted on a mounting board 11 in a predetermined arrangement. As shown in FIG. 2, external resistance elements are not mounted on the mounting board 11 so that the IC sockets 12 are mounted with a high mounting density.

Figure 3:
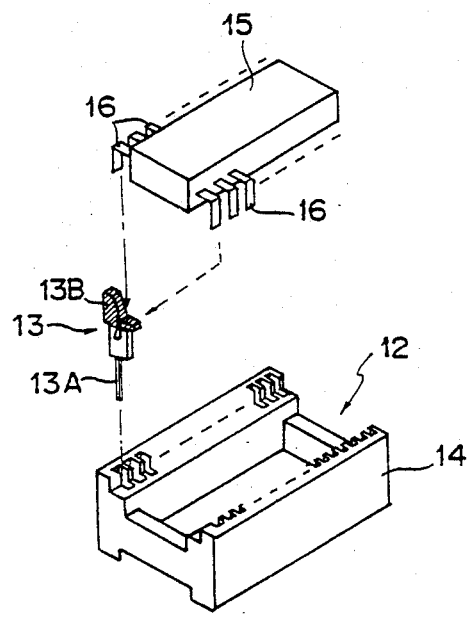
FIG. 3 is an enlarged perspective view showing an IC socket of the present invention.

FIG. 3 is an enlarged view of the IC socket 12.

In FIG. 3, the IC socket 12 has plural contacts 13 and a body portion 14 holding these contacts 13. The plural contacts 13 are positioned corresponding to each position of plural pins 16 of an IC 15 to be inserted in the IC socket 12.

The contacts 13 are formed of conductive resin. Such conductive resin can be composed of a conductive material ingredient and a synthetic resin ingredient. As the conductive material ingredient, metal powder, for example, metal fiber powder and carbon powder, for example, carbon fiber powder, and so on can be used. As the synthetic resin ingredient, known plastics can be widely used, especially, polyphenylene sulfide is excellent in heating-resisting property or heat durability.

A metal pin 13 A is fixed at the bottom of the contact 13 so that the contact is connected electrically through the metal pin 13 A to a test circuit ( not shown ) being an external circuit. Moreover, the upper end part of the contact 13 is coated with metallic thin film, for example, metal plating 13 B such as gold plating, which results in improvement of electrical stability and wear resistance of a contacting part of the contact 13 when contacted with the pin 16. However, the plating 13B is not necessarily needed.

According to the preferred embodiment as described above, it is possible to control electric resistance of the contact 13 itself to a desire valve. As a result, it become possible to make mounting of the external resistance elements on the board 11 unnecessary ( namely, the external resistance elements may not be connected between the contact and the test circuit ), when the contact 13 is used for the burn-in test, and operation efficiency of assemblying can be improved and the burn-in test can be implemented efficiently by raising a mounting density of the socket.

Besides, the contact 13 has superior resistance to corrosion environment and high productivity because of making a precise press processing unnecessary, differing from a metal contact.

In the above mentioned, the invention is applied to an IC socket usable for a burn-in test, however, it does not necessarily mean that the invention is applied only to an IC socket for a burn-in test, thus the invention can be applied widely to an IC socket in general.

Besides, the IC socket 12 can be constructed by inserting plural contacts 13 into the body portion 14 after making both separately. Or, an insert molding method can be adopted wherein plural contacts 13 are set in a mold used for molding the body portion 14 and the molding material is supplied into the mold. By the use of this method, productivity can be more improved. Besides, other than the example that the whole of the contact 13 is formed of conductive resin, it may be partly formed of conductive resin.

In the present invention, as mentioned above, because at least a part of a contact is formed of conductive resin, it is possible to provide an IC socket which has good resistance to corrosion environment and high productivity, and furthermore, can make mounting of external resistance elements unnecessary when used, for example, for a burn-in test.

What is claimed is:

1. A socket for mounting an integrated circuit unit for burn-in testing of the unit having a plurality of conductive contacts, and a body mounting the contacts in a selected arrangement for contacting respective pins of an integrated circuit unit, characterized in that each contact comprises a metal pin at one end of the contact for attaching the contact to an external burn-in test circuit and a conductive resin material connected to the metal pin to provide the contact with a selected electrical resistance suitable for providing burn-in testing of an integrated circuit unit mounted thereon.

2. A socket according to claim 1 further characterized in that the conductive resin material forms an opposite end of the contact for making contact with a pin of an integrated circuit unit inserted therein.

3. A socket according to claim 2 further characterized in that the conductive resin material comprises a synthetic resin ingredient having a conductive powder material therein.

4. A socket according to claim 3 further characterized in that the conductive resin material in the contact has a thin metal film thereon providing the conductive resin with improved electrical stability and wear resistance.

5. A socket according to claim 4 further characterized in that the synthetic resin embodied in the conductive resin material comprises polyphenylene sulfide.

* * * * *